United States Patent [19]

Nishihara et al.

[11] Patent Number: 5,062,567
[45] Date of Patent: Nov. 5, 1991

[54] LEAD DESIGN TO FACILITATE POST-REFLOW SOLDER JOINT QUALITY INSPECTION

[75] Inventors: H. Keith Nishihara, Los Altos, Calif.; P. Anthony Crossley, Austin, Tex.; Neil D. Hunt, Mountain View; J. Martin Tenenbaum, Portola Valley, both of Calif.

[73] Assignee: Schlumberger Technologies, Inc., San Jose, Calif.

[21] Appl. No.: 519,334

[22] Filed: May 1, 1990

Related U.S. Application Data

[63] Continuation of Ser. No. 286,834, Dec. 20, 1988, abandoned.

[51] Int. Cl.⁵ ............................................... H05K 3/34
[52] U.S. Cl. ..................................... 228/105; 29/843; 228/180.2
[58] Field of Search ............... 439/55, 78, 83, 876; 29/840, 843; 361/404, 405; 228/103-105, 180.2

[56] References Cited

U.S. PATENT DOCUMENTS 4,775,917 10/1988 Eichhorn et al. ..................... 29/843

FOREIGN PATENT DOCUMENTS

| 55-99731 | 7/1980 | Japan | 228/165 |
| 60-130132 | 7/1985 | Japan | 357/69 |
| 61-214548 | 9/1986 | Japan | 439/876 |

OTHER PUBLICATIONS

IBM Bulletin, vol. 29, No. 4, p. 1612, Improved Lead Structure, 9-1986.

Primary Examiner—Neil Abrams
Attorney, Agent, or Firm—Kenneth Olsen; David H. Carroll; Robert C. Colwell

[57] ABSTRACT

An improved lead for surface-mounted electronic components is described. The improved lead includes an opening through the portion of the lead to be placed in contact with the printed circuit board for soldering. The opening, having a diameter approximately equal to the thickness of the lead, enables the detection of correctly-soldered joints using automated inspection equipment. When the lead is correctly soldered, solder is drawn by capillary action into the opening where it forms a meniscus. By automatically detecting the curvature of the meniscus, the quality of the solder joint may be determined.

5 Claims, 6 Drawing Sheets

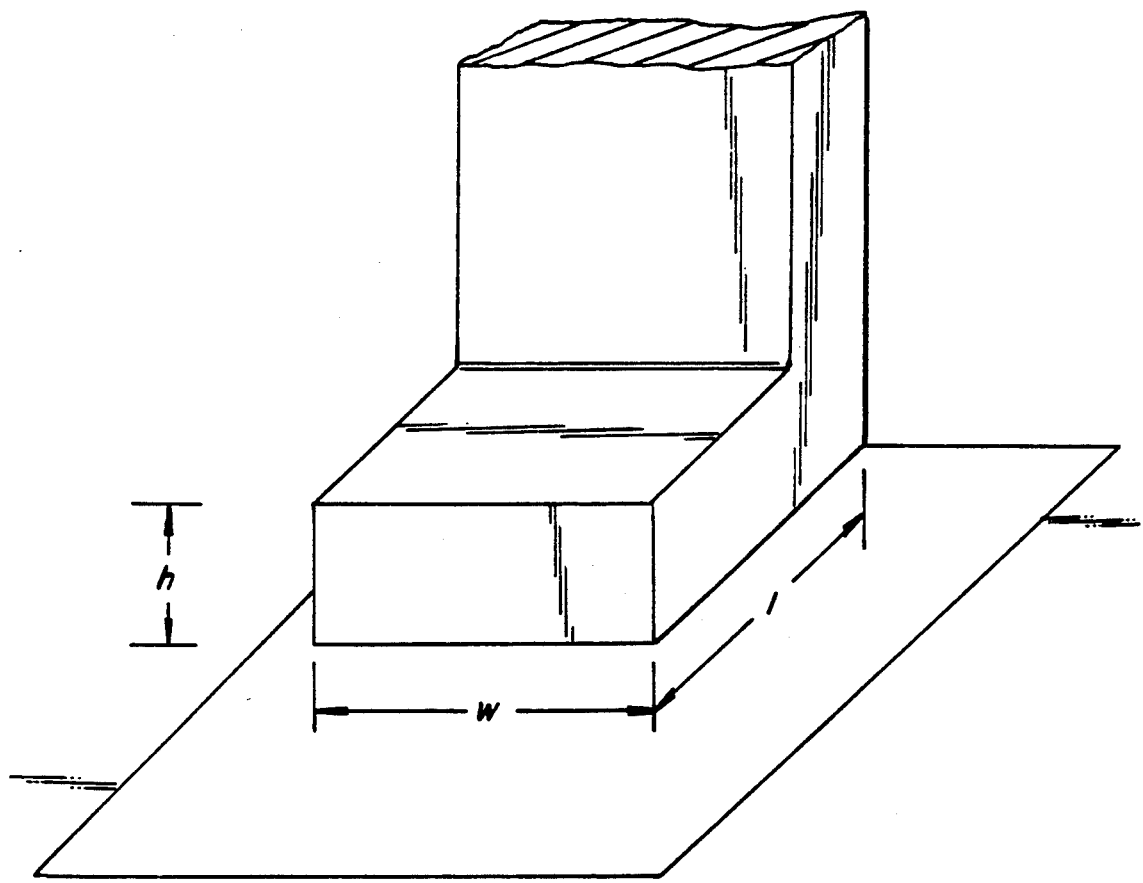
FIG._1.
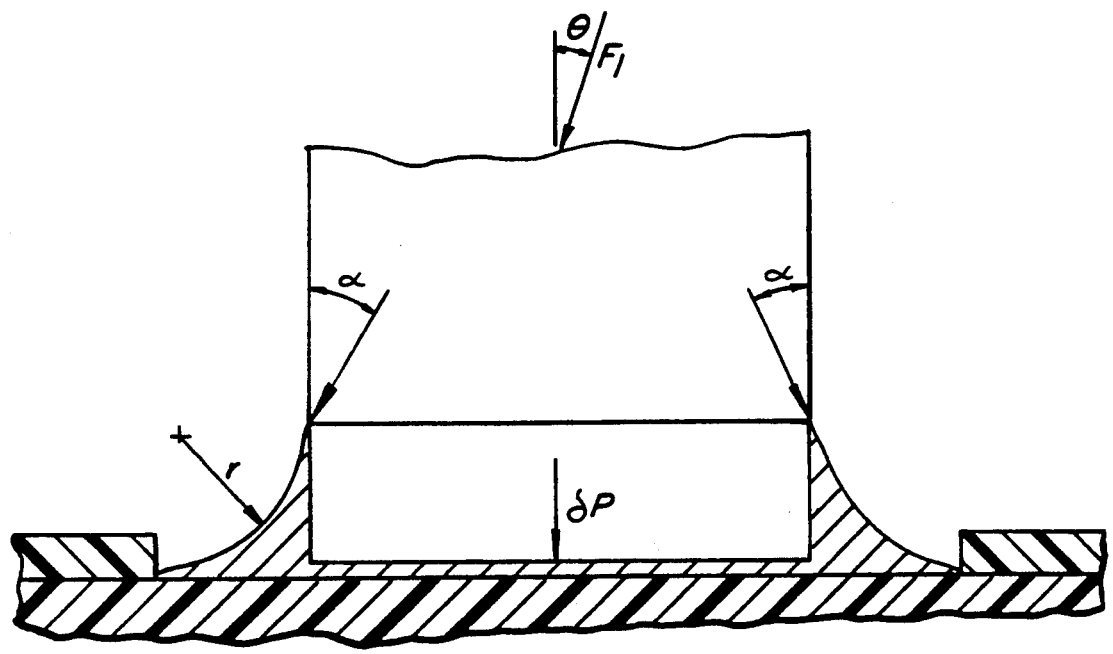
FIG._2.

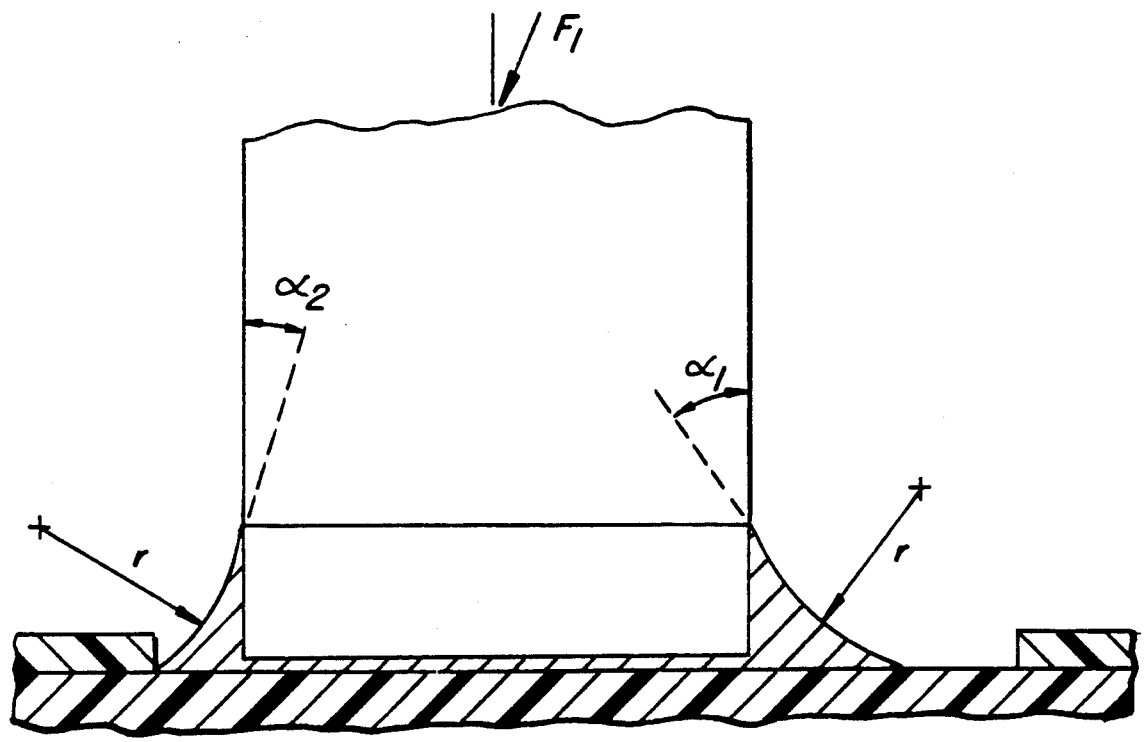
FIG._3.
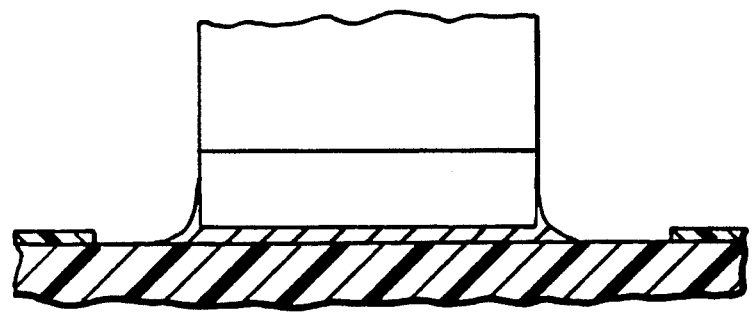
FIG._4A.
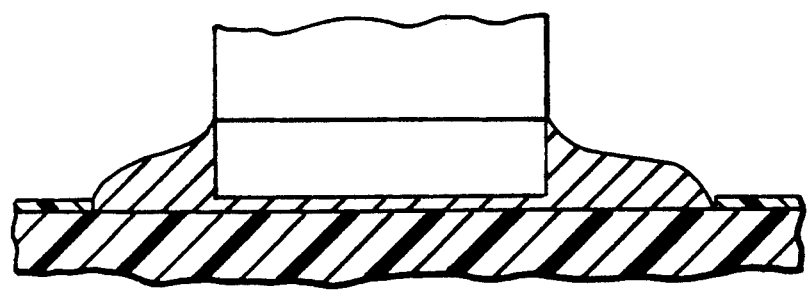
FIG._4B.

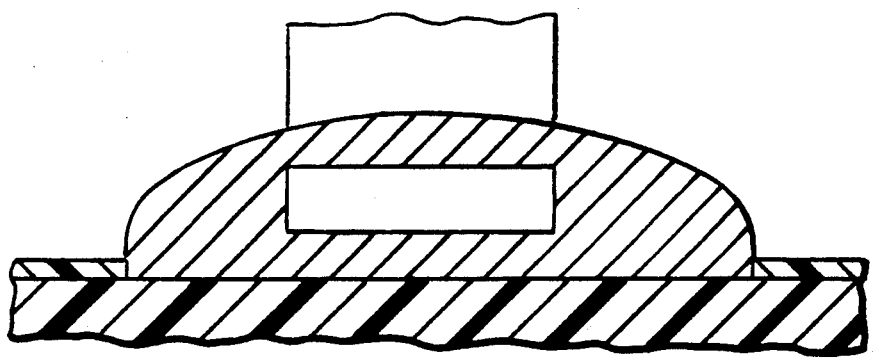
FIG._4C.
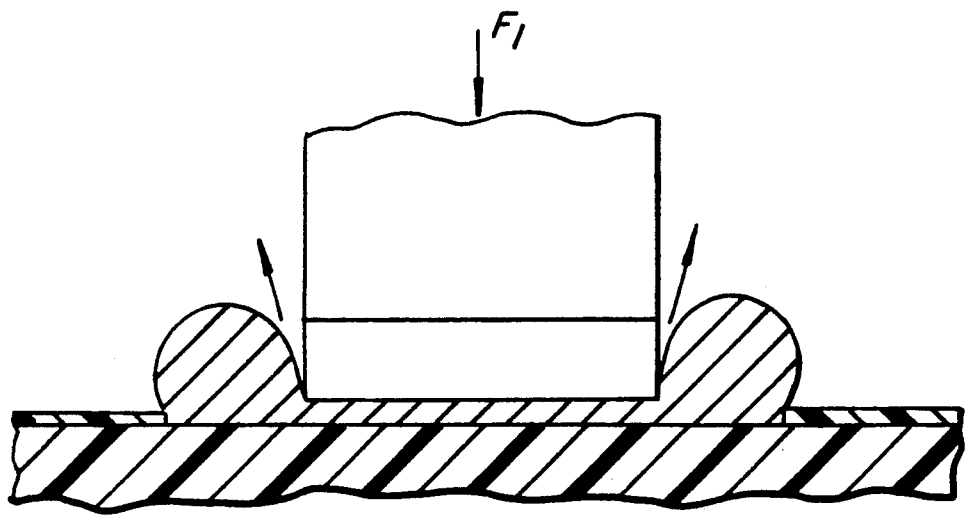
FIG._5A.
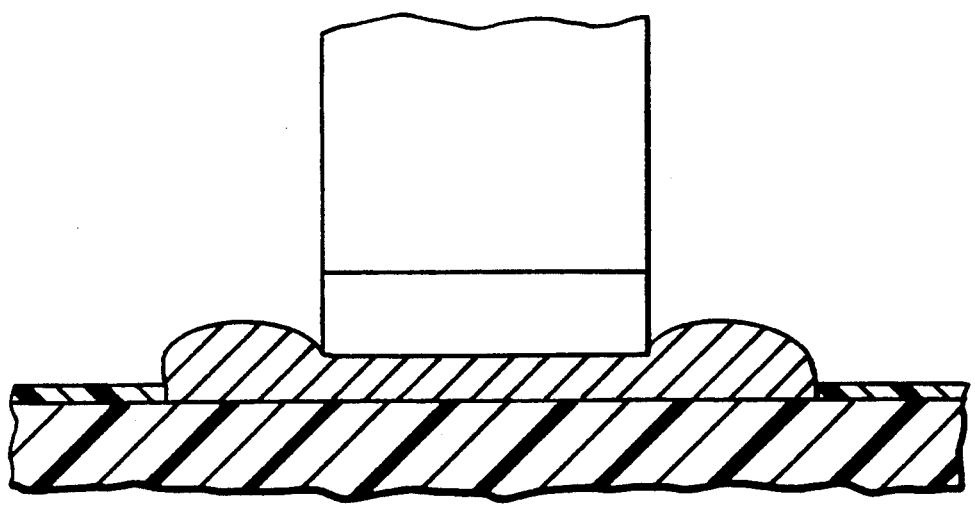
FIG._5B.

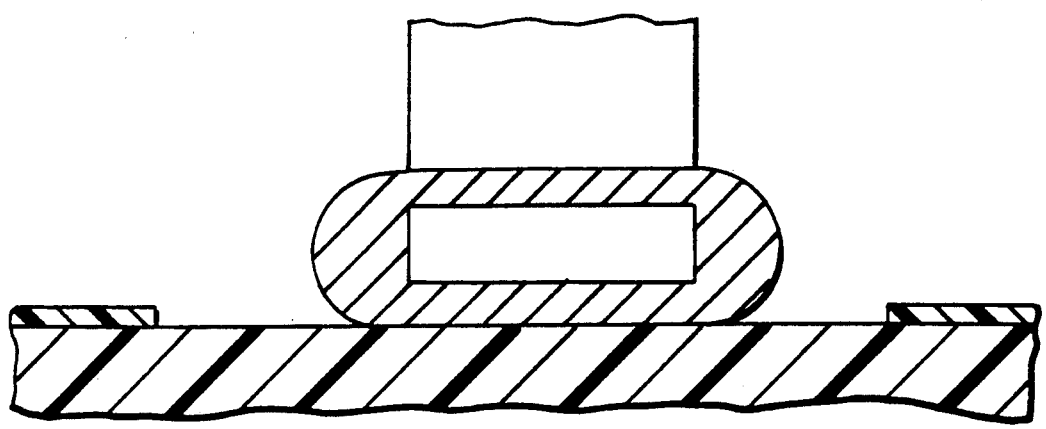
FIG._6.
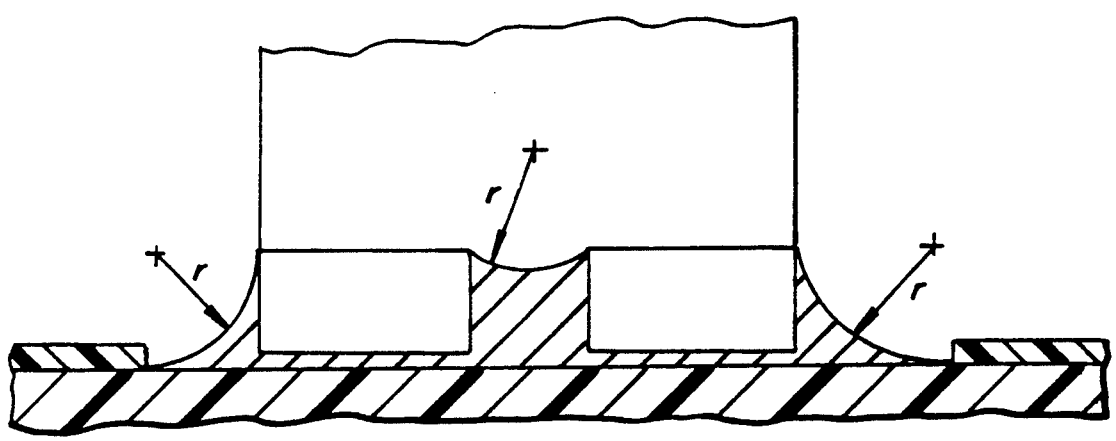
FIG._7A.
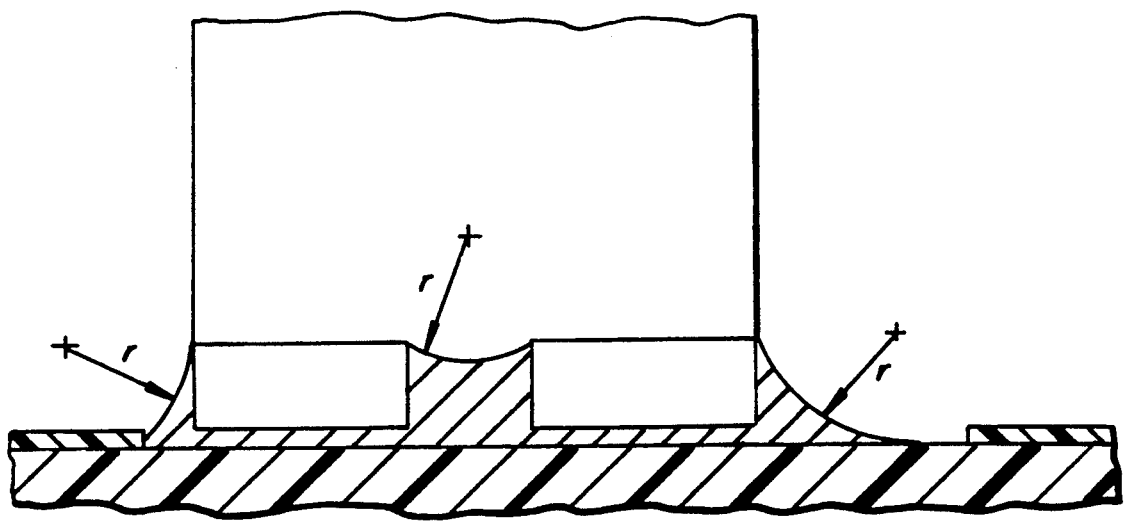
FIG._7B.

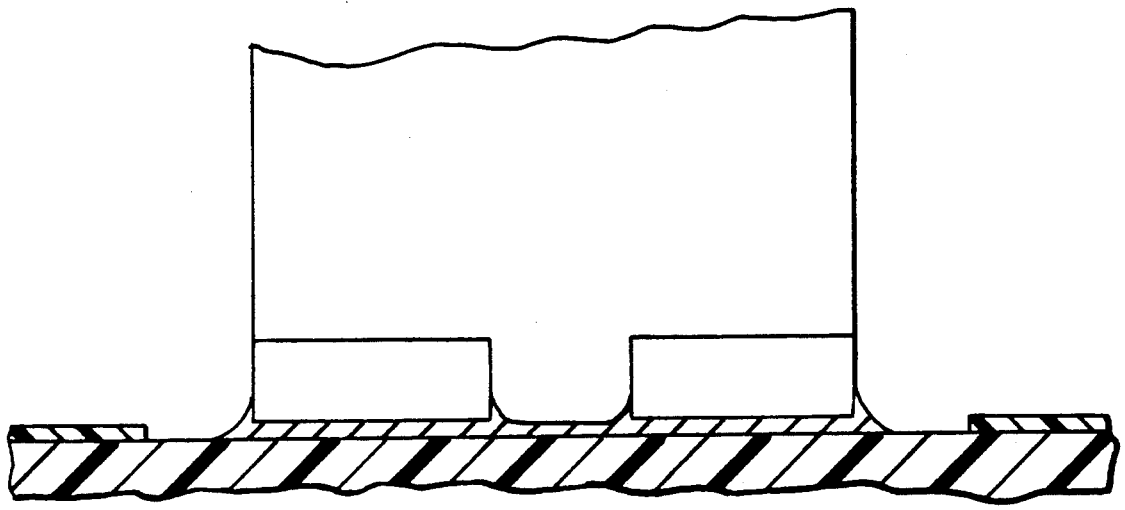
FIG._8A.
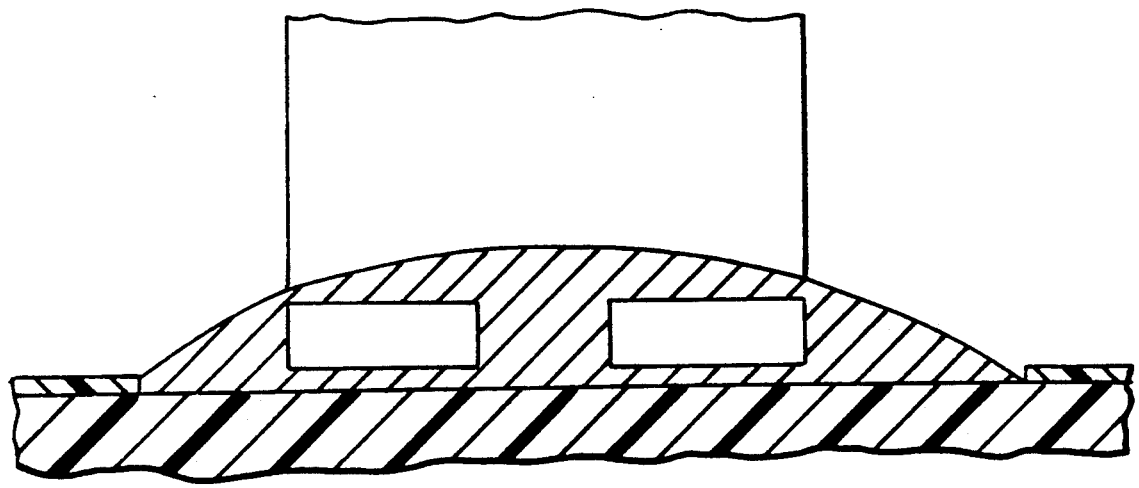
FIG._8B.

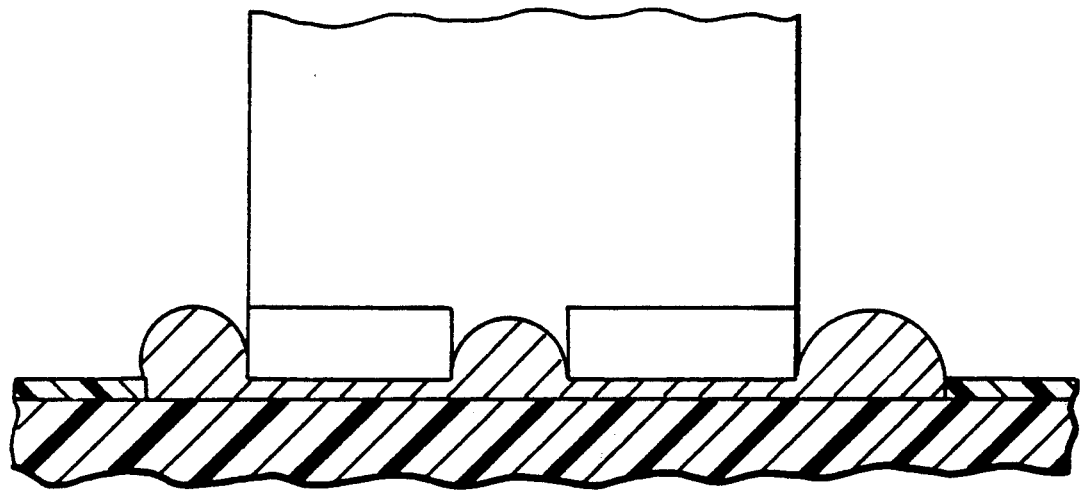
FIG._9A.
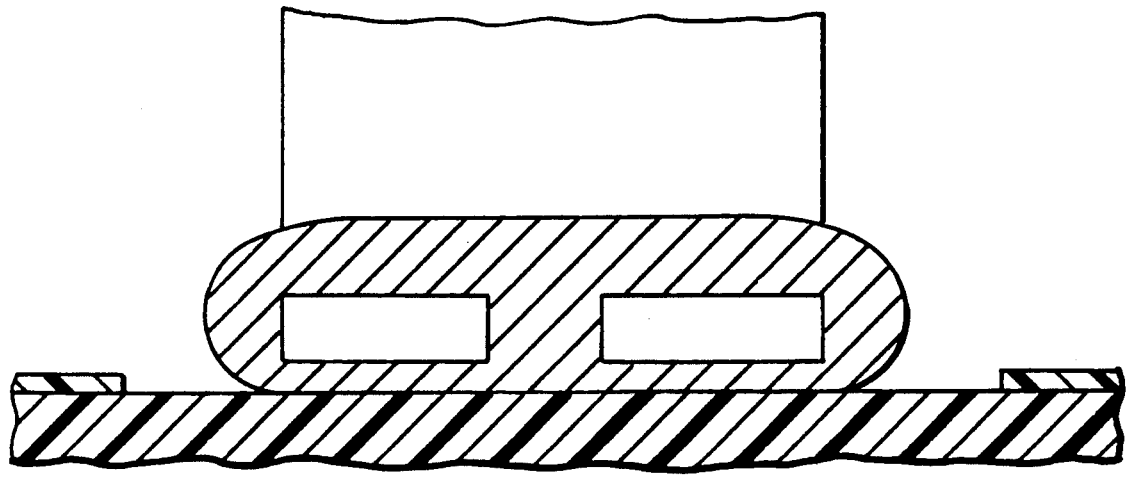
FIG._9B.

5,062,567

LEAD DESIGN TO FACILITATE POST-REFLOW SOLDER JOINT QUALITY INSPECTION

This is a continuation of application Ser. No. 286,834, filed Dec. 20, 1988 and now abandoned.

BACKGROUND OF THE INVENTION

1. Field of the Invention

This invention relates to the manufacture of circuit boards, and in particular to automated inspection of solder joints in surface-mounted electronic components.

2. Description of the Prior Art

The demand for high-performance electronic systems at low cost emphasizes the need for methods to increase the density of components on printed circuits boards. With their small physical dimensions, surface mount devices (SMDs) are becoming the preferred components for printed circuit boards. To retain the advantages of compact assembly, however, there is a need for quality-control methods to assess the quality of the solder joints which provide both mechanical and electrical connection between the board and the components mounted upon it. As complexity rises, maintaining constant mean-time-between-failures for the system requires improvement of the mean-time-between-failures for each component. Visual inspection of the solder joint after it has been formed is one potential solution.

For visual inspection of solder joints to be useful, several criteria must be met: the cost of implementation must be low; the method must be reliable; and the result must provide an accurate assessment of quality. Although sampling inspection is feasible, the cost of human operators for visual inspection is prohibitive for complete inspection. Furthermore, because humans are not well suited for such a repetitive task, the reliability is low.

Automated inspection systems based on computer analysis of images are feasible, but there are particular difficulties. Good quality solder joints have specular surfaces which create localized intensity highlights which dominate the scene information. These highlights are related to the surface profile, but are equally determined by lighting and adjacent objects. Furthermore, the shape of the solder fillet between the component lead and the circuit board land depends on their relative mechanical alignment, and on the quantity of solder present in the joint. While the shape of the fillet is important, there is a range of possible shapes which are acceptable. Confounding these factors makes image analysis difficult or impossible.

SUMMARY OF THE INVENTION

The design of manufacturing materials and processes offers hope for reducing cost and improving quality. In particular, designs which increase the ability to inspect the resulting product are one important way to allow automated inspection. To be acceptable, such improved designs must offer a benefit greater than their cost of implementation, and must not affect functionality. Usually this implies that the feature offering improved manufacturability should require only a modest change in the basic functional design.

The invention herein is a small change in the design of component leads which improves the reliability of automated visual inspection of post-reflow solder joints between SMDs and printed circuit boards. The change involves adding a hole or similar structure to the component lead, such that at reflow the molten solder is drawn up the bore of the hole by capillary action when a sound joint is forming. This provides a visually observable effect relatively independent of alignment between component and board, but strongly dependent on the contact angle between the molten solder and the component lead. Since lack of wetting between the molten solder and the component lead is a frequent source of solder joint defects, this technique provides a sensitive and easily detected visual change to measure joint quality.

In a preferred embodiment our invention for a solderable lead for an integrated circuit includes a metal lead having a first portion thereof disposed to be placed on a printed circuit board trace. An opening is provided which extends through the first portion of the metal lead. When the lead is soldered, solder is drawn into the opening, enabling inspection of the solder joint.

BRIEF DESCRIPTION OF THE DRAWINGS

FIG. 1 is a perspective view of one lead from a surface-mount-device and the printed-circuit-board land to which it is attached by solder, identifying the geometric dimensions used herein.

FIG. 2 is a cross-section of a well-formed solder joint, showing the configuration of the solder fillet which forms around the periphery of the component lead as the molten solder wets the lead and the PCB land.

FIG. 3 is a cross-section of the asymmetric solder fillets which arise from displacement of the component lead relative to the board land, and the lateral force which arises as a consequence of this displacement.

FIGS. 4a–4c are cross-sections of defective solder joints caused by improper quantities of solder, where FIG. 4a shows insufficient solder; FIG. 4b shows a mild excess of solder; and FIG. 4c shows a gross excess of solder.

FIGS. 5a and 5b are cross-sections of improper joints caused by solder not wetting the component lead, with FIG. 5a illustrating the case in which the lead force overcomes surface tension force and the lead remains in contact with board land. FIG. 5b shows the case in which the surface tension force is greater than the lead force causing the lead to be lifted away from the board.

FIG. 6 is a cross-section of an improper joint caused by solder not wetting the board land in which surface tension tends to lift the lead away from the land.

FIGS. 7a and 7b are cross-sections showing the behavior of solder in a hole traversing a component lead, with FIG. 7a illustrating an ideal joint; and FIG. 7b showing a well-formed joint with misalignment.

FIGS. 8a and 8b are cross-sections showing the behavior of solder in a hole traversing a component lead, with FIG. 8a showing insufficient solder; and FIG. 8b showing excess solder.

FIGS. 9a and 9b are cross-sections showing the behavior of solder in a hole traversing a component lead, with FIG. 9a showing a component lead which is not wetted; and FIG. 9b showing a board land which is not wetted.

DETAILED DESCRIPTION OF THE PREFERRED EMBODIMENT

Basic Issues Affecting Solder Joint Quality

There are many factors which determine the quality of a solder joint, but these combine to produce a limited range of visually inspectable phenomena. Not all defects can be observed directly, but some important sources of defects create visually detectable effects under appropriate conditions. Below we describe several sources of defects, and the visual effects they create.

Low temperature during reflow leads to inadequate activation of the flux, resulting in a lack of complete wetting of the lead. The degree of wetting determines the contact angle between the liquid solder and the lead. This affects the fillet shape, a visually inspectable attribute.

High temperature during reflow leads to potential damage to the board or the component, and metallurgical effects such as dissolution of the component lead or board trace material into the solder. In extreme cases, the metallurgical effects can alter the specular surface of the final joint, but effects which will alter the mechanical strength of the joint, the component, or the board can be present but visually undetectable.

Chemical contamination can prevent the solder from wetting the component leads or the board lands. The usual cause is heavy hydrocarbons, silicones, or metal oxides which are resistant to the solvent action of the flux. These contaminants may be present on the SMDs, the board traces, or the solder stock. As these problems affect wetting angle, they can be detected visually. On the other hand, contamination may also lead to corrosion, or reduced mechanical strength in the joint, without being visually detectable during manufacture.

Insufficient solder leads to incomplete coverage of the surfaces to be joined. Excess solder forms a joint in which the component lead is not drawn down against the board, or, worse yet, the solder spreads over the upper surface of the component lead, reducing its compliance, and possibly causing electrical shorts between adjacent connections.

Determination of Fillet Shape

The reflow cycle is generally sufficiently long that the molten pool of solder can be considered to arrive at static equilibrium, and dynamic effects can be ignored. Under these conditions, the parameters which determine the shape of the fillet are:

1. The surface energy (surface tension) of the molten solder.
2. The contact angle $\phi$ between the liquid solder and the solid surfaces. In a joint with effective surface wetting, this is vanishingly small rising to a finite value for joints with inadequate wetting.
3. The sum of the external forces acting on the SMD lead, for instance a vertical component arising from the weight of the device, and a horizontal component arising from reactions of other leads, or from mechanical constraints on the horizontal motion of the device. This sum is F dynes at an angle $\theta$ to the vertical.
4. The hydrostatic forces within the molten solder, arising from its density of $\rho$ grams per cubic centimeter.

FIG. 1 is a perspective view of a SMD solder joint which shows the geometry used in the following discussion. The following discussion is limited to situations physically plausible within the constraints of the SMD-to-PCB assembly process. These are treated only in sufficient detail to provide an understanding of the technique of this invention. In particular, torque about the axis of the lead is neglected. Such torque would arise from a rotationally asymmetrical fillet caused by angular misalignment between the SMD lead and the board land.

As shown in the figure, a typical "gull wing" lead is considered to be an L-shaped body with its foot parallel to the board land. The foot has dimensions $\omega$ by 1 in the plane of the board, and h perpendicular to the board. A solder mask surrounds the board land, preventing the solder from wetting the board beyond the edge of this mask. In the absence of unusual external forces acting on the lead, we have determined that two parameters control the final configuration of the joint--volume of solder, and wetting angle.

FIG. 2 is a cross-sectional view of a well-formed joint. The wetting angle of the solder is vanishingly small, and the volume of solder is such that a concave fillet is formed when the foot of the lead is in contact with the board land. Under these conditions, the surface tension of the liquid solder draws the lead down onto the board, this force being added to the vertical component of the lead force from the part. There is an additional force acting on the exposed surface of the lead, caused by the pressure differential across the meniscus. This force allows the pressure within the liquid to be different from the ambient. Neglecting, for a moment, the hydrostatic pressure differential caused by the density of the liquid solder, the vertical forces on the lead can be summed to yield:

$$F_t = F_l \cos\theta + \int s \cos\alpha\, dx + \omega l \delta p \quad (1)$$

where $F_t$ is the total force, $F_l$ is the force transferred through the lead, the integral is around the periphery of the lead foot, and $\delta p$ is the pressure differential arising from the concavity of the meniscus. If $\alpha$ is constant around the periphery of the foot:

$$\int s \cos\alpha\, dx = 2s(\omega+1)\cos\alpha \quad (2)$$

Treating the meniscus as a membrane with a radius of curvature r, the pressure differential is given by:

$$\delta p = s/r \quad (3)$$

In equilibrium, this radius of curvature must be constant around the lead. This fact can be used to treat the case of asymmetrical fillets caused by translation of the lead relative to the land, as described below. The hydrostatic pressure differential caused by the density of the solder is:

$$\delta p_h = h\rho \quad (4)$$

between the top and bottom of the solder meniscus at the edge of the lead. For lead-tin 37/63 solder at 280° C., s is 490 dynes/cm and $\rho$ is 8.5 gm/cm$^3$. Taking a representative value for h as 0.010 inch (0.025 cm), and assuming the fillet radius is equal to this lead height, Equation 3 shows that the meniscus pressure differential in such a joint would be 19,600 dynes/cm$^2$ (0.28 psi). From Equation 4 the hydrostatic pressure differential would be 208 dynes/cm$^2$. Thus, in this scale range, for a well-formed joint, the hydrostatic forces can be neglected in comparison with the meniscus forces, and surface tension effects are dominant.

If the external force $F_1$ has a component parallel to the plane of the board ($\theta \neq 0$), it is balanced by an asymmetry in the fillet, as shown in FIG. 3, such that:

$$F_1 \sin\theta = ls(\sin\alpha_1 - \sin\alpha_2) \quad (5)$$

The pressure differential caused by the curvature of the meniscus does not contribute, since at equilibrium this must be constant around the lead. Equation 5 shows that displacement of the lead from the center of the land causes a force which acts in a direction to oppose the displacement. This is the origin of the well-known effect that SMDs tend to move towards centering during reflow.

Assuming the board and lead to be wetted, as the volume of solder increases, the shape of the meniscus changes, and the pressure differential arising from the meniscus shape reverses direction: representative cross-sections are shown in FIGS. 4a–4c. Of particular interest is the case shown in FIG. 4b, where the volume is such that (in the absence of gravity) the meniscus would have no curvature. In this case, the hydrostatic pressure variation within the solder is dominant, and in the presence of gravity the meniscus actually forms a convex shape near the board and a concave shape near the edge of the lead, as shown in the figure. The force arising from the pressure differential of the meniscus, which previously acted to draw the lead into close contact with the board, is absent. Thus, the joint quality can be expected to deteriorate. Beyond this volume of solder, and provided the solder wets the upper surface of the lead, the solder will form a layer of finite thickness above the lead, a condition recognized as unsatisfactory. This is shown in FIG. 4c.

The only situations considered thus far have been when the component lead and the board land are wetted by the solder. For these cases the meniscus shape is a measure of the volume of solder. In contrast, if the component lead is not wetted by the solder, the situations shown in FIGS. 5a and 5b arise. In all cases the surface tension of the liquid solder meniscus acts to lift the lead away from the board. In FIG. 5a the external force transferred to the lead is sufficient to overcome the lifting force, so that the foot of the lead remains in contact with the board. In FIG. 5b the external force is less than the lifting force, and the component floats away from the board. The relationships between force components are as in Equation 1, but the convexity of the meniscus creates a positive pressure differential which adds to the surface tension term in lifting the component lead.

If the board land is not wetted, the solder forms a deformed ball shape around the component lead, as shown in FIG. 6, and again the net result is to lift the component away from the board. In both cases, unacceptable solder joints are formed.

Thus, meniscus shape is a good measure of the joint formation conditions during reflow. Unfortunately, however, the change in shape of the meniscus cannot be detected reliably by visual inspection. This is because the specular surface of the solder prevents sure determination of its surface contour, and in any case the visual appearance of the meniscus is in part determined by the relative alignment between the board land and the component lead.

Capillary Action within a Hole

Under conditions of good joint formation, if there is a hole through the foot of the lead, as shown in FIGS. 7a and 7b, capillary action will tend to draw molten solder upwards into this hole, forming a meniscus within the hole. The position and shape of this meniscus is a sensitive measure of the conditions within the joint at the time of its formation, because the position and shape are determined by both wetting angle and the pressure differential caused by the peripheral meniscus. The behavior of the molten solder within the hole is determined by its diameter as well as the wetting and peripheral meniscus curvature, so this parameter can be controlled to yield the desired behavior.

For the purposes of this analysis, we assume a hole with diameter equal to the height h of the foot of the lead, and then show how changes in the diameter can be used to control the behavior of the meniscus to allow visual phenomena to act as a quality control measure. The choice of this particular hole diameter is made only for purposes of illustration.

FIGS. 7a and 7b shows the shape of the meniscus within the hole under conditions which result in well-formed joints. In FIG. 7a, the ideal joint with a concave peripheral fillet creates a meniscus at the top of the hole with the same radius of curvature as the peripheral fillet. The solder rises to the top of the hole by capillary action because the hydrostatic pressure differential caused by the height of the hole is small compared to the pressure differential caused by the surface tension acting over the concave meniscus, as shown in the discussion of Equations 3 and 4. If the part is misaligned to the board land, but the joint remains well-formed, the behavior of the solder in the hole is very little changed. This is shown in FIG. 7b, and the insensitivity to alignment errors is a significant advantage of our proposal.

FIGS. 8a and 8b illustrates the behavior of the solder within the hole under conditions which will lead to ill-formed joints. In FIG. 8a, the joint is formed with less solder than desired, so that the radius of curvature of the peripheral fillet is less than the hole radius. The meniscus within the hole cannot sustain the capillary action, and the solder does not rise to the upper surface. This change can be easily detected visually, and is broadly independent of lead placement. This change in capillary action is sharp, so that control of the hole radius can be used to select for a specific minimum peripheral fillet radius.

In FIG. 8b, excess solder is present so that the peripheral fillet is no longer concave. Under these conditions the meniscus at the top of the hole also loses its concavity, and this condition can be readily detected visually, since the definition of the meniscus edge will be lost. Again, this condition is broadly independent of lead placement, a desirable feature.

Under conditions when there is improper wetting of either the component lead or the board land, the situations illustrated in FIGS. 9a and 9b arise. In FIG. 9a, the component lead is not wetted, preventing the capillary action which allows the solder to rise into the hole. In FIG. 9b, the board land is not wetted, and as before the solder results in a deformed ball around the component lead. In both cases, reliable visual cues are available to detect these unacceptable conditions.

In summary, the addition of a hole to the component lead provides a method for allowing reliable visual inspection of reflowed SMD solder joints. In the well-formed joint, the solder forms a meniscus with a well-defined edge and a concave surface. In all other cases the meniscus is either absent or has an ill-defined edge.

Device Lead Manufacture

The lead frames that ultimately become the component leads of gull wing SMD devices are manufactured from metal foil stock, with the desired final shape being generated by photolithography and etching, followed by lead trimming and forming after assembly of the component.

Adding holes to the center of the lead foot is most easily done during definition of the original lead frame, rather than during trimming and forming. This, however, requires greater resolution in the photolithography process that forms the leads, since the holes are necessarily smaller than the leads. Because the hole diameter is greater than the foil stock thickness, this resolution is practical.

To avoid the need to increase photolithographic resolution, an alternative process of fabrication is to add a process step in which a focused laser is used to create the hole. The thin foil stock makes this approach technically feasible using commercially available lasers.

The condition of the solder in the opening may be detected in any desired manner, for example, by positioning a camera overhead looking straight down into the holes. A ring-shaped light source illuminating the board from an angle will cause properly formed solder beads in the hole to reflect a bright spot, while improperly formed leads do not yield a bright spot.

A second approach to detection is to employ X-ray imaging of the board to check for filled holes. Because the lead in the solder absorbs X-rays significantly more than the metal in part leads or traces, the image will show the total amount of solder present over each portion of the image.

This invention offers a technique to allow board manufacturers to increase the quality of their product by permitting full inspection of component joint quality. It is therefore most relevant to applications where reliability is at a premium, for instance, military systems and components in large systems such as communication networks and computers where downtime is expensive.

We claim:

1. A method of inspecting solder joints in surface-mounted electronic components comprising:
   placing an electrical component on a board said component having a plurality of leads;
   soldering said leads to said board with solder material, thereby forming a peripheral fillet of solder around each lead periphery;
   selecting a lead, a portion of said lead having a vertical hole therethrough of preselected diameter; and
   inspecting the quality of the peripheral fillet by observing the meniscus of said solder material through said hole.

2. A method according to claim 1 in which said selecting step comprises said hole having a diameter substantially equal to the height of said portion of said lead.

3. A method according to claim 2 in which said observing step comprises visually observing the meniscus formed in said hole by capillary action.

4. A method according to claim 3 in which said visually observing comprises positioning a camera overhead looking down into said hole and illuminating said board with a light source.

5. A method according to claim 2 in which said observing step comprises x-raying the board and reviewing the resulting x-ray image.

* * * * *